(12) United States Patent
Zhang et al.

(10) Patent No.: US 9,876,071 B2
(45) Date of Patent: Jan. 23, 2018

(54) STRUCTURES TO AVOID FLOATING RESURF LAYER IN HIGH VOLTAGE LATERAL DEVICES

(71) Applicant: Texas Instruments Incorporated, Dallas, TX (US)

(72) Inventors: Yongxi Zhang, Plano, TX (US); Philip L Hower, Concord, MA (US); John Lin, Chelmsford, MA (US); Guru Mathur, Plano, TX (US); Scott G. Balster, Dallas, TX (US); Constantin Bulucea, Sunnyvale, CA (US); Zachary K. Lee, Fremont, CA (US); Sameer P Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/634,801

(22) Filed: Feb. 28, 2015

(65) Prior Publication Data
US 2016/0254346 A1 Sep. 1, 2016

(51) Int. Cl.
| | |
|---|---|
| H01L 29/06 | (2006.01) |
| H01L 29/78 | (2006.01) |
| H01L 29/10 | (2006.01) |
| H01L 23/485 | (2006.01) |
| H01L 29/423 | (2006.01) |

(52) U.S. Cl.
CPC ........ *H01L 29/063* (2013.01); *H01L 29/0692* (2013.01); *H01L 29/1045* (2013.01); *H01L 29/1095* (2013.01); *H01L 29/7816* (2013.01); *H01L 29/7835* (2013.01); *H01L 23/485* (2013.01); *H01L 29/1083* (2013.01); *H01L 29/42368* (2013.01)

(58) Field of Classification Search
CPC  H01L 29/063; H01L 29/0882; H01L 29/7816
USPC ......................................................... 257/339
See application file for complete search history.

(56) References Cited

U.S. PATENT DOCUMENTS

| | | | | |
|---|---|---|---|---|
| 2001/0053581 | A1* | 12/2001 | Mosher | ............... H01L 29/7835 438/297 |
| 2002/0030225 | A1* | 3/2002 | Nakamura | .......... H01L 29/0615 257/338 |
| 2010/0301411 | A1* | 12/2010 | Takeda | ................ H01L 29/0696 257/335 |

(Continued)

*Primary Examiner* — Peter Bradford
(74) *Attorney, Agent, or Firm* — Jacqueline J. Garner; Charles A. Brill; Frank D. Cimino

(57) ABSTRACT

A semiconductor device contains an LDNMOS transistor with a lateral n-type drain drift region and a p-type RESURF region over the drain drift region. The RESURF region extends to a top surface of a substrate of the semiconductor device. The semiconductor device includes a shunt which is electrically coupled between the RESURF region and a low voltage node of the LDNMOS transistor. The shunt may be a p-type implanted layer in the substrate between the RESURF layer and a body of the LDNMOS transistor, and may be implanted concurrently with the RESURF layer. The shunt may be through an opening in the drain drift region from the RESURF layer to the substrate under the drain drift region. The shunt may be include metal interconnect elements including contacts and metal interconnect lines.

11 Claims, 8 Drawing Sheets

(56) References Cited

U.S. PATENT DOCUMENTS

2012/0032273 A1* 2/2012 Suzuki ............ H01L 21/823814
                                                    257/369
2012/0299055 A1* 11/2012 Fujii .................... H01L 29/739
                                                    257/139
2015/0179793 A1* 6/2015 Denison .............. H01L 29/7823
                                                    257/337

* cited by examiner

STRUCTURES TO AVOID FLOATING RESURF LAYER IN HIGH VOLTAGE LATERAL DEVICES

FIELD OF THE INVENTION

This invention relates to the field of semiconductor devices. More particularly, this invention relates to extended drain transistors in semiconductor devices.

BACKGROUND OF THE INVENTION

Some semiconductor devices contain lateral extended drain n-channel metal oxide semiconductor (LDNMOS) transistors. The LDNMOS transistor has a lateral n-type drain drift region under a p-type RESURF layer. When the LDNMOS transistor is in an off state, a depletion region at the pn junction between the RESURF layer and the drain drift region extends into the drain drift region. When the LDNMOS transistor is switched to an on state, the depletion region inhibits current through the drain drift region, undesirably causing an increase in the on-state resistance of the LDNMOS transistor. The depletion region diminishes over a few milliseconds as charge is collected in the RESURF layer to form an equilibrium state with the drain drift region in the on state. The increased on-state resistance immediately after switching to the on state disadvantageously dissipates power in the LDNMOS transistor and reduces an efficiency of a switching circuit using the LDNMOS transistor.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device contains an LDNMOS transistor with a lateral n-type drain drift region. A p-type RESURF region lies over at least a portion of the drain drift region. The RESURF region extends to a top surface of a substrate of the semiconductor device. The semiconductor device includes a shunt which is electrically coupled between the RESURF region and a low voltage node of the LDNMOS transistor. The shunt may be a lateral shunt of a p-type implanted layer in the substrate between the RESURF layer and a p-type body of the LDNMOS transistor. The shunt may be a vertical shunt through an opening in the drain drift region from the RESURF layer to a p-type region in the substrate under the drain drift region. The shunt may be formed of metal interconnect elements including contacts and metal interconnect lines of a first metal level of the semiconductor device.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device contains an LDNMOS transistor with a lateral n-type drain drift region under a p-type RESURF region. The RESURF region extends to a top surface of a substrate of the semiconductor device. The semiconductor device includes a shunt which is electrically coupled between the RESURF region and a low voltage node of the LDNMOS transistor. The shunt may be a lateral shunt of a p-type implanted layer in the substrate between the RESURF layer and a p-type body of the LDNMOS transistor. The shunt may be a vertical shunt through an opening in the drain drift region from the RESURF layer to a p-type region in the substrate under the drain drift region. The shunt may be formed of metal interconnect elements including contacts and metal interconnect lines of a first metal level of the semiconductor device.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et.al, "Thin Layer High Voltage Devices" Philips J, Res. 35 1-13, 1980.

Figure 1A:
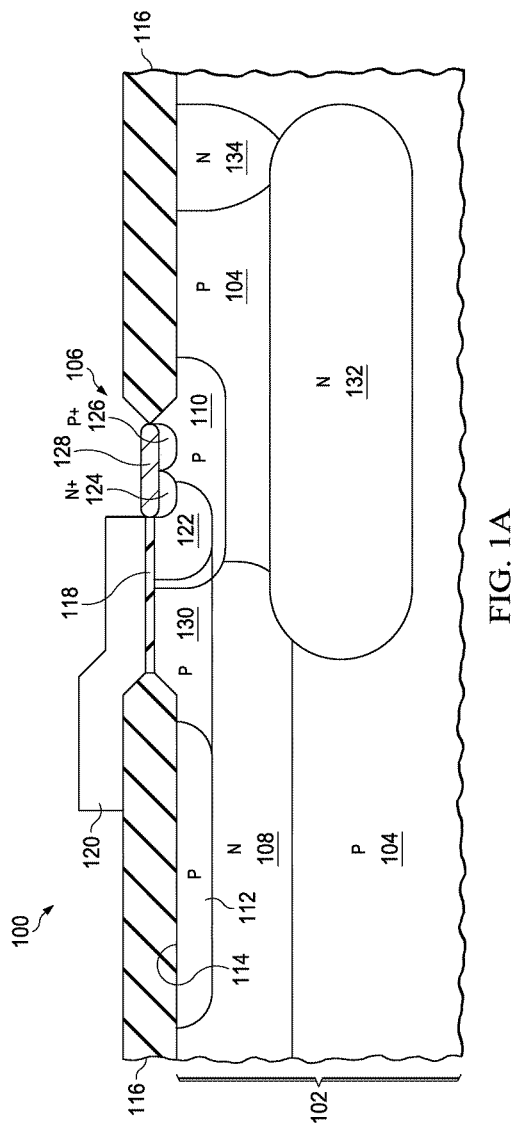
FIG. 1A through FIG. 1C are views of an example semiconductor device containing an LDNMOS transistor with a shunted RESURF layer.
Figure 1B:
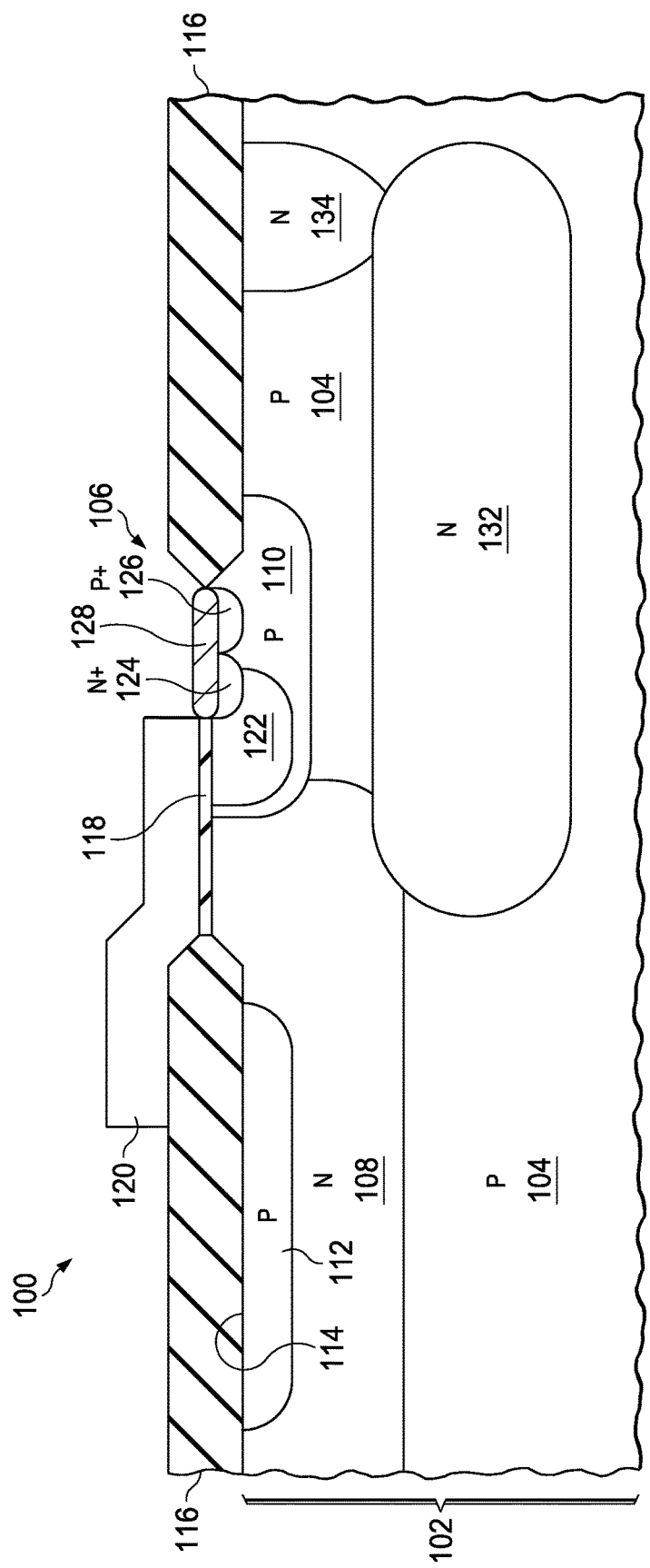
Figure 1C:
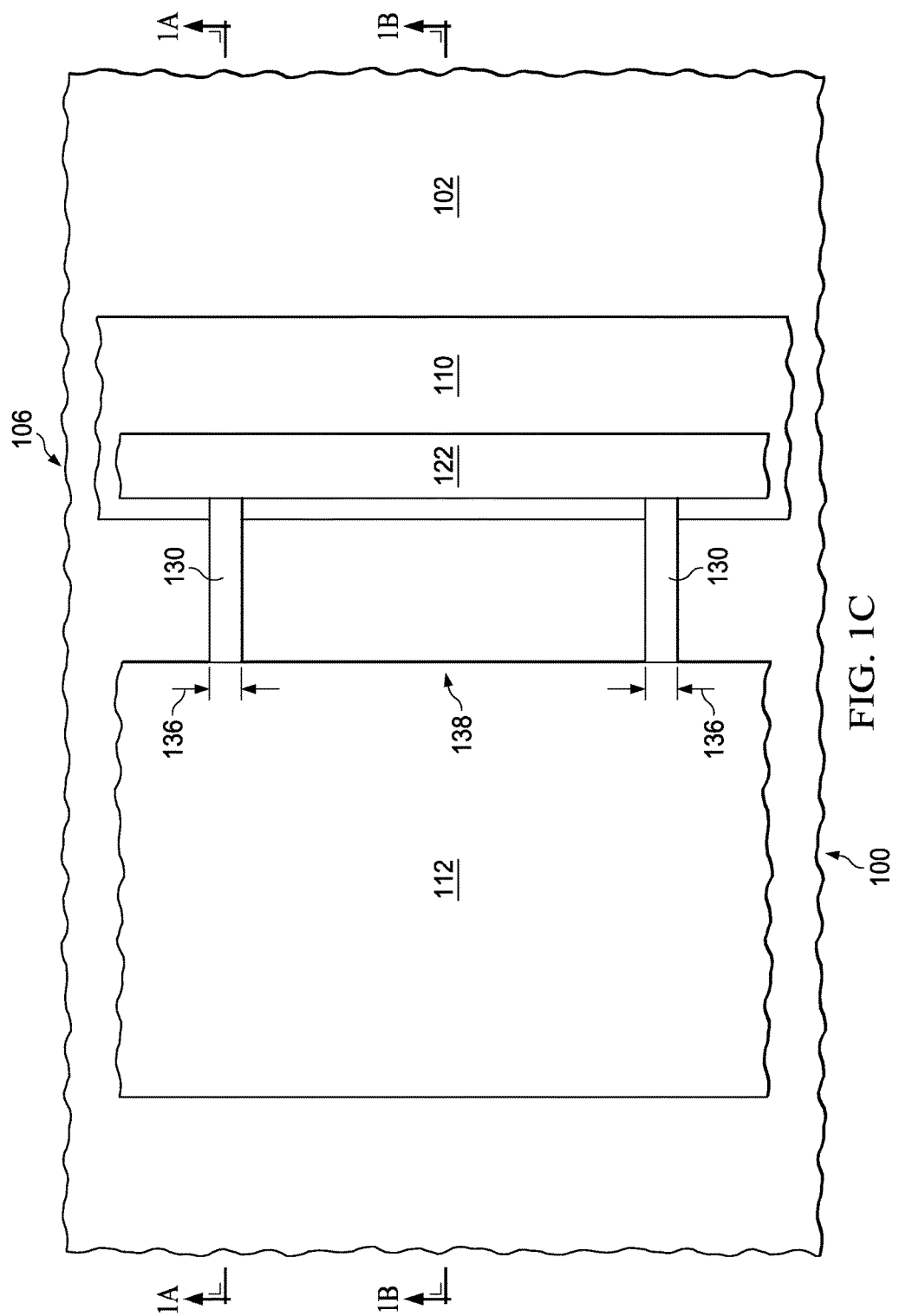

FIG. 1A through FIG. 1C are views of an example semiconductor device containing an LDNMOS transistor with a shunted RESURF layer. FIG. 1A is a cross section of the semiconductor device through a lateral shunt between the RESURF layer and a body of the LDNMOS transistor. The semiconductor device 100 is formed on a substrate 102 which includes a p-type semiconductor material 104. The substrate 102 may be a single crystal silicon wafer, and the p-type semiconductor material 104 may an epitaxial layer formed on a bulk wafer. The p-type semiconductor material 104 may have a resistivity of 50 ohm-cm to 300 ohm-cm, for example. The semiconductor device 100 contains an LDNMOS transistor 106. The LDNMOS transistor 106 includes an n-type lateral drain drift region 108 which extends in the substrate 102 from a drain contact region, not shown in FIG. 1A, to a p-type body 110 of the LDNMOS transistor 106. A p-type RESURF layer 112 is disposed in the substrate 102 over at least a portion of the drain drift region 108. The RESURF layer 112 extends to a top surface 114 of the substrate 102 and is disposed under field oxide 116 formed over the substrate 102. The RESURF layer 112 may be, for example, 200 nanometers to 2 microns thick, and may have an average doping density of $5 \times 10^{16}$ cm$^{-3}$ to $5 \times 10^{17}$ cm$^{-3}$. A gate dielectric layer 118 is formed over the substrate 102 where the drain drift region 108 meets the body 110. A gate 120 of the LDNMOS transistor 106 is formed over the gate dielectric layer 118, and may extend over the field oxide 116 above the drain drift region 108 and the RESURF layer 112. In the instant example, a threshold adjustment region 122 containing p-type dopants may be disposed in the body 110 under the gate 120. An n-type source 124 is disposed in the body 110 adjacent to the gate 120, and a p-type body contact region 126 is disposed in the body 110 adjacent to the source 124. A layer of metal silicide 128 may be disposed on the source 124 and the body contact region 126.

A p-type lateral shunt 130 is disposed in the substrate 102 connecting the RESURF layer 112 with the body 110. The lateral shunt 130 may be, for example, 300 nanometers to 2 microns thick, and may have an average doping density of $8 \times 10^{16}$ cm$^{-3}$ to $8 \times 10^{17}$ cm$^{-3}$. The lateral shunt 130 extends a short distance, for example 1 micron to 5 microns, out of the plane of FIG. 1A. A resistance of the lateral shunt 130 may be, for example, 1000 ohms to 10000 ohms. During operation of the semiconductor device 100, the shunt 130 allows charge to flow between the RESURF layer 112 and the body 110. When the LDNMOS transistor 106 is switched from an off state to an on state, charge flows through the shunt 130 to the RESURF layer 112, reducing a depletion region at a pn junction between the RESURF layer 112 and the drain drift region 108, which advantageously reduces an on-state resistance of the LDNMOS transistor 106.

The semiconductor device 100 may optionally include an n-type buried layer 132 in the substrate 102 which abuts the drain drift region 108 and extends under the body 110, and an n-type sinker 134 disposed in the substrate 102 which extends to the buried layer 132. The buried layer 132 and the sinker 134 isolate the body 110 from the p-type semiconductor material 104 below the buried layer 132, allowing the LDNMOS transistor 106 to be operated at an elevated potential.

FIG. 1B is a cross section of the semiconductor device 100 through a position which does not include the shunt 130 of FIG. 1A. In the position of FIG. 1B, the RESURF layer 112 extends proximate to the gate dielectric layer 118. The drain drift region 108 extends up to the gate dielectric layer 118, between the RESURF layer 112 and the body 110. During operation of the semiconductor device 100, when the LDNMOS transistor 106 is in the off state, the RESURF layer 112 reduces an electric field in the drain drift region 108 so as to prevent breakdown. When the LDNMOS transistor 106 is in the on state, an inversion channel in the drain drift region 108 immediately under the gate dielectric layer 118 provides a low resistance.

FIG. 1C is a top view of the semiconductor device 100 showing a plurality of shunts. The field oxide 116, gate dielectric layer 118 and gate 120 of FIG. 1A and FIG. 1B are removed in FIG. 1C to more clearly show the shunt configuration. The semiconductor device 100 has the RESURF layer 112 laterally separated from the body 110. The threshold adjustment region 122 is disposed in the body 110. Each of the shunts 130 extends from the RESURF layer 112 to the body 110 and possibly to the threshold adjustment region 122 as depicted in FIG. 1C. A width 136 of each shunt 130 may be, for example, 1 micron to 5 microns. The shunts 130 may occupy between 0.1 percent and 10 percent of a perimeter 138 of the RESURF layer 112 adjacent to the body 110, which may provide a desired low area for the LDN-MOS transistor 106 which advantageously maintains a desired fabrication cost of the semiconductor device 100.

Referring to FIG. 1A through FIG. 1C collectively, the semiconductor device 100 may be formed by starting with a silicon wafer as a lower part of the substrate 102 and forming a first p-type epitaxial layer to provide a lower portion of the semiconductor material 104. The buried layer 132 may be formed by implanting n-type dopants such as antimony using an implant mask into the first epitaxial layer, followed by a thermal drive process and subsequent formation of a second p-type epitaxial layer to provide the substrate 102 with the buried layer 132. The field oxide 116 may formed by a local oxidation of silicon (LOCOS) process or by a shallow trench isolation (STI) process. The drain drift region 108 and the sinker 134 are formed by implanting n-type dopants such as phosphorus into the substrate 102 using an implant mask, followed by a thermal drive to diffuse the phosphorus so that the drain drift region 108 and the sinker 134 abut the buried layer 132. The body 110 is formed by implanting p-type dopants such as boron into the substrate 102 using an implant mask, followed by an anneal operation which diffuses the boron.

The RESURF layer 112, the threshold adjustment region 122 and the shunts 130 may be formed concurrently by implanting boron in at least two doses into the substrate 102 using an implant mask. A first dose of $1 \times 10^{12}$ cm$^{-2}$ to $1 \times 10^{13}$ cm$^{-2}$ and an energy of 100 keV to 250 keV penetrates the field oxide 116 to provide a desired doping distribution for the RESURF layer 112. A second dose of $3 \times 10^{12}$ cm$^{-2}$ to $5 \times 10^{13}$ cm$^{-2}$ and an energy of 10 keV to 30 keV forms a desired doping density at the top surface 114 of the substrate 102 in the threshold adjustment region 122; the second dose is substantially absorbed in the field oxide 116 over the drain drift region 108. The boron implants are followed by an anneal operation in a rapid thermal processor. Forming the RESURF layer 112, the threshold adjustment region 122 and the shunts 130 concurrently may advantageously reduce fabrication cost and complexity of the semiconductor device 100. Alternatively, any of the RESURF layer 112, the threshold adjustment region 122 and the shunts 130 may be formed separately, for example to increase performance of the LDNMOS transistor 106.

The gate dielectric layer 118, gate 120, source 124 and body contact region 126 are formed subsequently to the RESURF layer 112, the threshold adjustment region 122 and the shunts 130. The LDNMOS transistor 106 may have a closed loop configuration with a central drain, a linear configuration, or other configuration.

An extended drain p-channel metal oxide semiconductor (PMOS) transistor, with an n-type RESURF layer over a p-type lateral drain drift region and lateral shunts between the RESURF layer and an n-type body, may be formed as described in reference to FIG. 1A through FIG. 1C by appropriate change of polarities of dopants.

Figure 2:
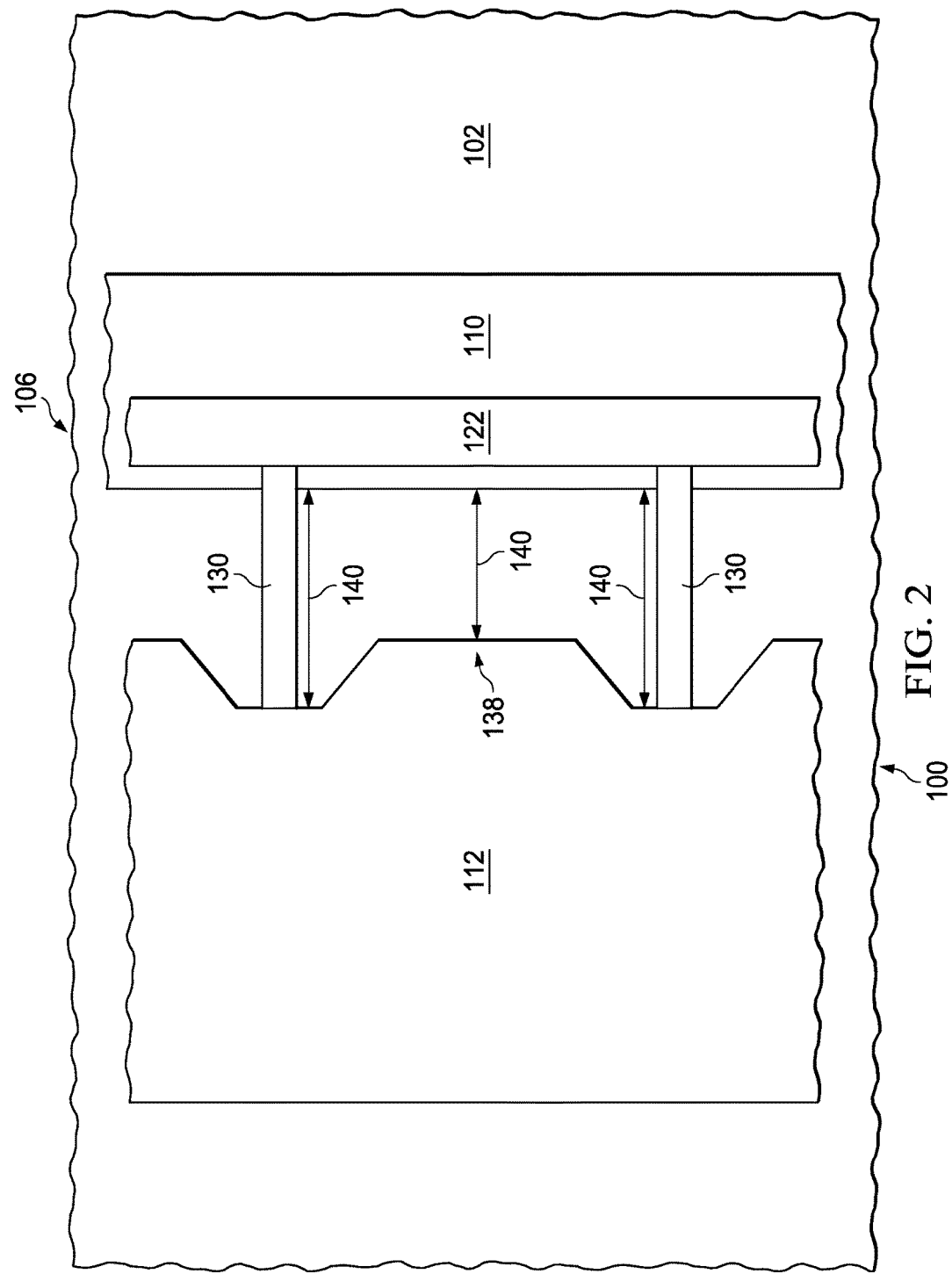
FIG. 2 is a top view of the semiconductor device having a different configuration of the RESURF layer and the shunts.

FIG. 2 is a top view of the semiconductor device 100 having a different configuration of the RESURF layer 112 and the shunts 130. The field oxide 116, gate dielectric layer 118 and gate 120 of FIG. 1A and FIG. 1B are removed in FIG. 2. The threshold adjustment region 122 is disposed in the body 110. Each of the shunts 130 extends from the RESURF layer 112 to the body 110 and possibly to the threshold adjustment region 122. In the instant example, the RESURF layer 112 is laterally separated from the body 110 by a varying distance 140. Adjacent to each shunt 130, the RESURF layer 112 is laterally recessed, so that the distance 140 adjacent to the shunt 130 is, for example, 1 micron to 5 microns longer than the distance 140 several microns away from the shunt 130. Recessing the RESURF layer 112 may advantageously provide a desired reduction of an electric field in the drain drift region 108 of FIG. 1A and FIG. 1B while providing a desired resistance of the shunts 130.

Figure 3A:
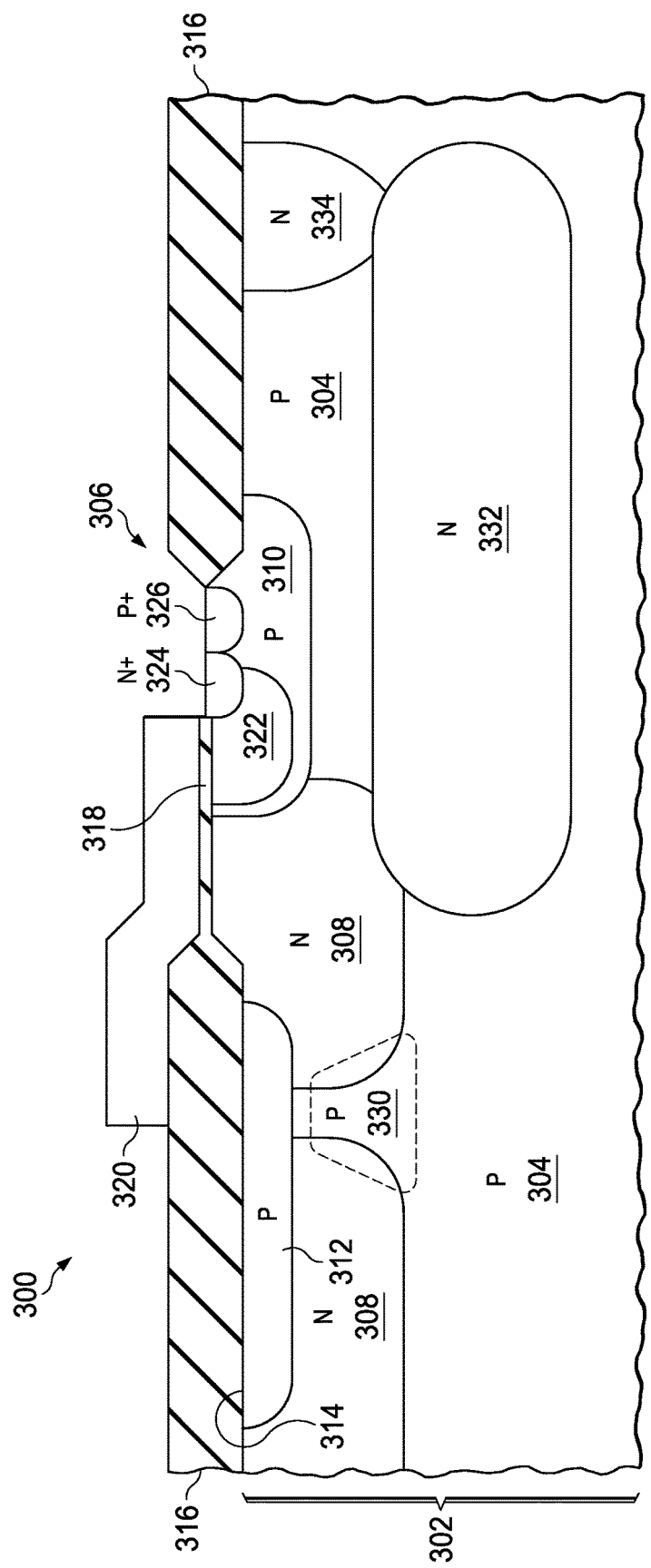
FIG. 3A through FIG. 3C are views of another example semiconductor device containing an LDNMOS transistor with a shunted RESURF layer.
Figure 3B:
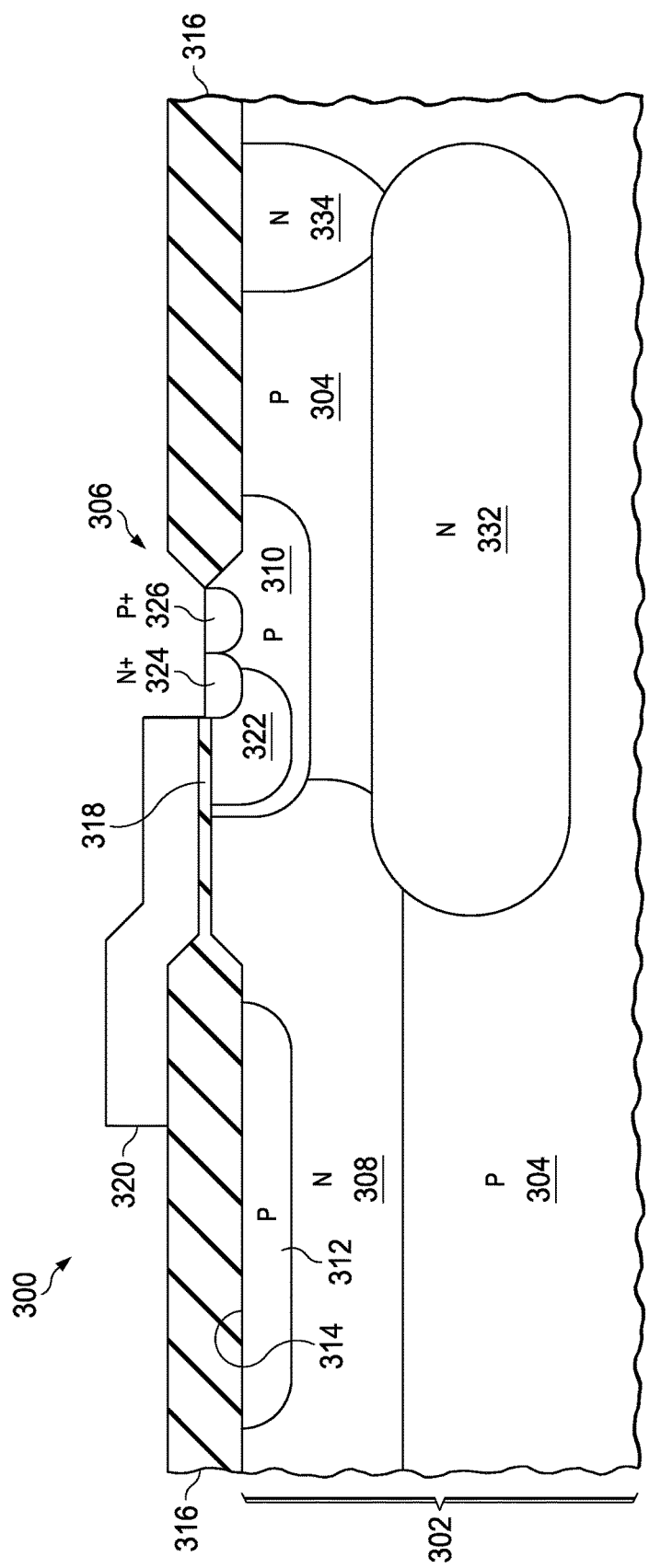
Figure 3C:
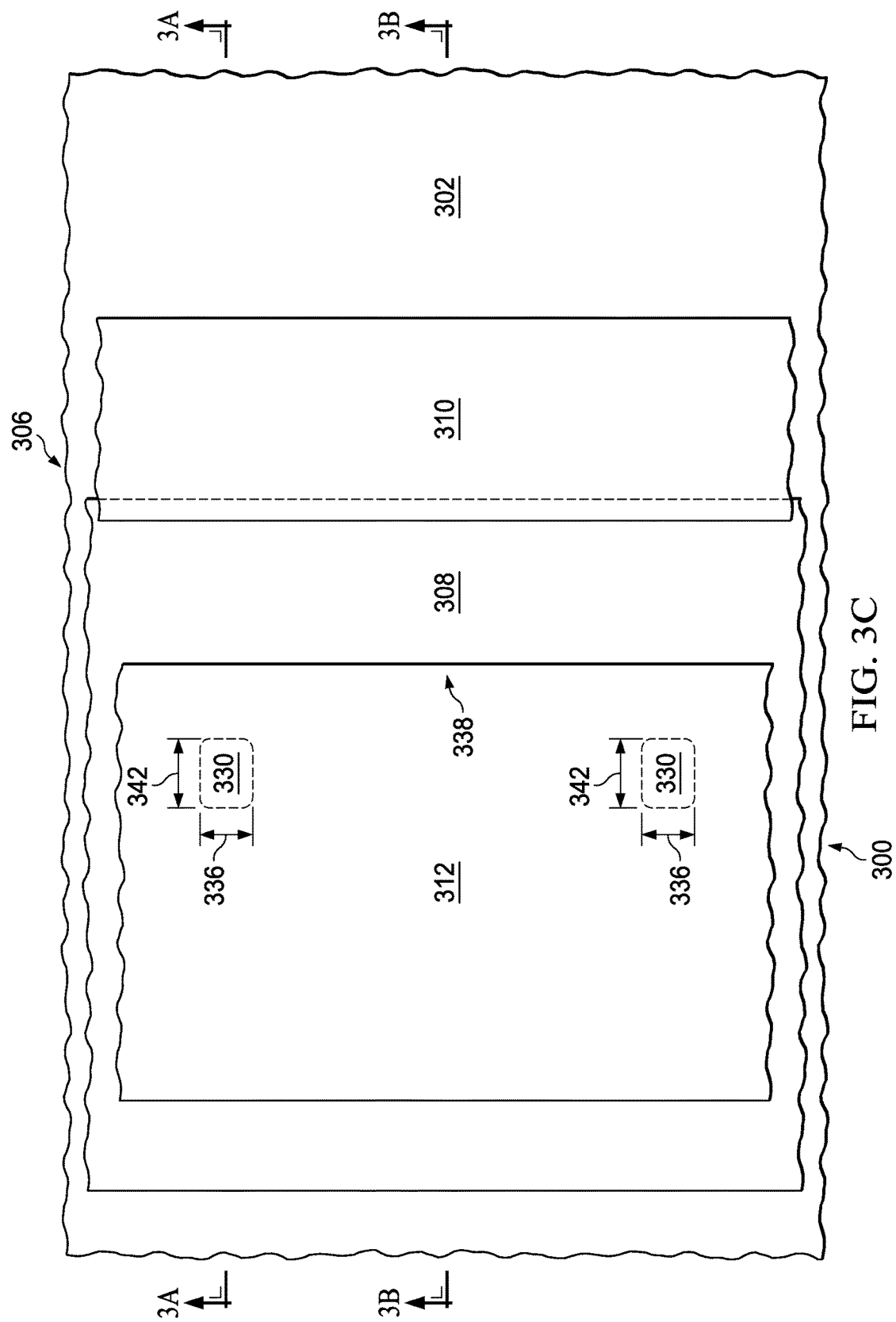

FIG. 3A through FIG. 3C are views of another example semiconductor device containing an LDNMOS transistor with a shunted RESURF layer. FIG. 3A is a cross section of the semiconductor device through a vertical shunt between the RESURF layer and a substrate region of the semiconductor device. The semiconductor device 300 is formed on a substrate 302 which includes a p-type semiconductor material 304, for example as described in reference to FIG. 1A. The semiconductor device 300 contains an LDNMOS transistor 306 which includes an n-type lateral drain drift region 308 in the substrate 302 from a drain contact region, not shown in FIG. 3A, to a p-type body 310 of the LDNMOS transistor 306. A p-type RESURF layer 312 is disposed in the substrate 302 over at least a portion of the drain drift region 308. The RESURF layer 312 extends to a top surface 314 of the substrate 302 and is disposed under field oxide 316 formed over the substrate 302. The RESURF layer 312 may be, for example, 200 nanometers to 2 microns thick, and may have an average doping density of $5\times10^{16}$ cm$^{-3}$ to $5\times10^{17}$ cm$^{-3}$. A gate dielectric layer 318 is formed over the substrate 302 where the drain drift region 308 meets the body 310. A gate 320 of the LDNMOS transistor 306 is formed over the gate dielectric layer 318, and may extend over the field oxide 316 above the drain drift region 308 and the RESURF layer 312. A threshold adjustment region 322 containing p-type dopants may be disposed in the body 310 under the gate 320. An n-type source 324 is disposed in the body 310 adjacent to the gate 320, and a p-type body contact region 326 is disposed in the body 310 adjacent to the source 324.

A p-type vertical shunt 330 is disposed in an opening in the drain drift region 308 connecting the RESURF layer 312 with the p-type semiconductor material 304 below the drain drift region 308. The vertical shunt 330 extends only a few microns out of the plane of FIG. 3A. A resistance of the vertical shunt 330 may be, for example, 5000 to 50000 ohms. During operation of the semiconductor device 300, the vertical shunt 330 allows charge to flow between the RESURF layer 312 and the p-type semiconductor material 304. The vertical shunt 330 advantageously reduces an on-state resistance of the LDNMOS transistor 306 as described in reference to FIG. 1A.

The semiconductor device 300 may optionally include an n-type buried layer 332 and an n-type sinker 334 disposed in the substrate 302 which isolate the body 310 from the p-type semiconductor material 304 below the buried layer 332. The semiconductor device 300 may include metal silicide on exposed silicon at the top surface 314 of the substrate 302, as discussed in reference to FIG. 1A and FIG. 1B.

FIG. 3B is a cross section of the semiconductor device 300 through a position which does not include the shunt 330 of FIG. 3A. In the position of FIG. 3B, the drain drift region 308 extends continuously up to the gate dielectric layer 318, between the RESURF layer 312 and the body 310. During operation of the semiconductor device 300, when the LDNMOS transistor 306 is in the off state, the continuous drain drift region 308 depletes so as to prevent breakdown. When the LDNMOS transistor 306 is in the on state, an inversion channel in the drain drift region 308 immediately under the gate dielectric layer 318 provides a low resistance.

FIG. 3C is a top view of the semiconductor device 300 showing a plurality of shunts. The field oxide 316, gate dielectric layer 318 and gate 320 of FIG. 3A and FIG. 3B are removed in FIG. 3C to more clearly show the shunt configuration. The semiconductor device 300 has the RESURF layer 312 laterally separated from the body 310. The drain drift region 308 extends under the RESURF layer 312 and to the body 310. The shunts 330, which are openings in the drain drift region 308, are disposed under the RESURF layer 312, proximate to the body 310, as depicted in FIG. 3C. For example, the shunts 330 may be laterally separated from the body 310 by less than 3 microns. A width 336 of each shunt 330 may be, for example, 2 microns to 8 microns. A length 342 of each shunt 330 may be, for example, 2 microns to 8 microns. The combined widths 336 of the shunts 330 may be between 0.1 percent and 10 percent of a perimeter 338 of the RESURF layer 312 adjacent to the body 310. The length 342 of each shunt 330 may be selected to provide a desired total resistance of the combined shunts 330.

Referring to FIG. 3A through FIG. 3C collectively, the semiconductor device 300 may be formed by starting with a silicon wafer and forming a first p-type epitaxial layer to provide a lower portion of the semiconductor material 304. The buried layer 332 and a second p-type epitaxial layer may be formed as described in reference to FIG. 1A through FIG. 1C to provide the buried layer 332 and the substrate 302. The field oxide 316 may formed by a LOCOS process or by an STI process. The body 310 is formed as described in reference to FIG. 1A through FIG. 1C.

The drain drift region 308 and the sinker 334 may be formed concurrently by forming an implant mask which exposes areas for the drain drift region 308 and the sinker 334 and covers areas for the shunts 330. The implant mask over the areas for the shunts 330 is sized to account for subsequent diffusion of n-type dopants from adjacent implanted areas. N-type dopants such as phosphorus are implanted into the substrate 302 in the areas exposed by the implant mask; the n-type dopants are blocked from the areas for the shunts 330. The phosphorus may be implanted at a dose of $2\times10^{12}$ cm$^{-2}$ to $2\times10^{13}$ cm$^{-2}$ at an energy of 200 keV to 2000 keV. Subsequently, a thermal drive process heats the substrate 302 to diffuse and activate the phosphorus, forming the drain drift region 308 and the sinker 334, and leaving openings in the drain drift region 308 for the shunts 330. The thermal drive process may include, for example, a furnace anneal at 1050° C. to 1200° C. for 200 minutes to 500 minutes.

The RESURF layer 312 and the threshold adjustment region 322 are subsequently formed, possibly concurrently, as described in reference to FIG. 1A through FIG. 1C. The gate dielectric layer 318, gate 320, source 324 and body contact region 326 are formed subsequently to the RESURF layer 312. The LDNMOS transistor 306 may have a closed loop configuration with a central drain, a linear configuration or other configuration.

An extended drain PMOS transistor, with an n-type RESURF layer over a p-type lateral drain drift region and vertical shunts through the drain drift region between the RESURF layer and n-type material in the substrate below the drain drift region, may be formed as described in reference to FIG. 3A through FIG. 3C by appropriate change of polarities of dopants.

Figure 4:
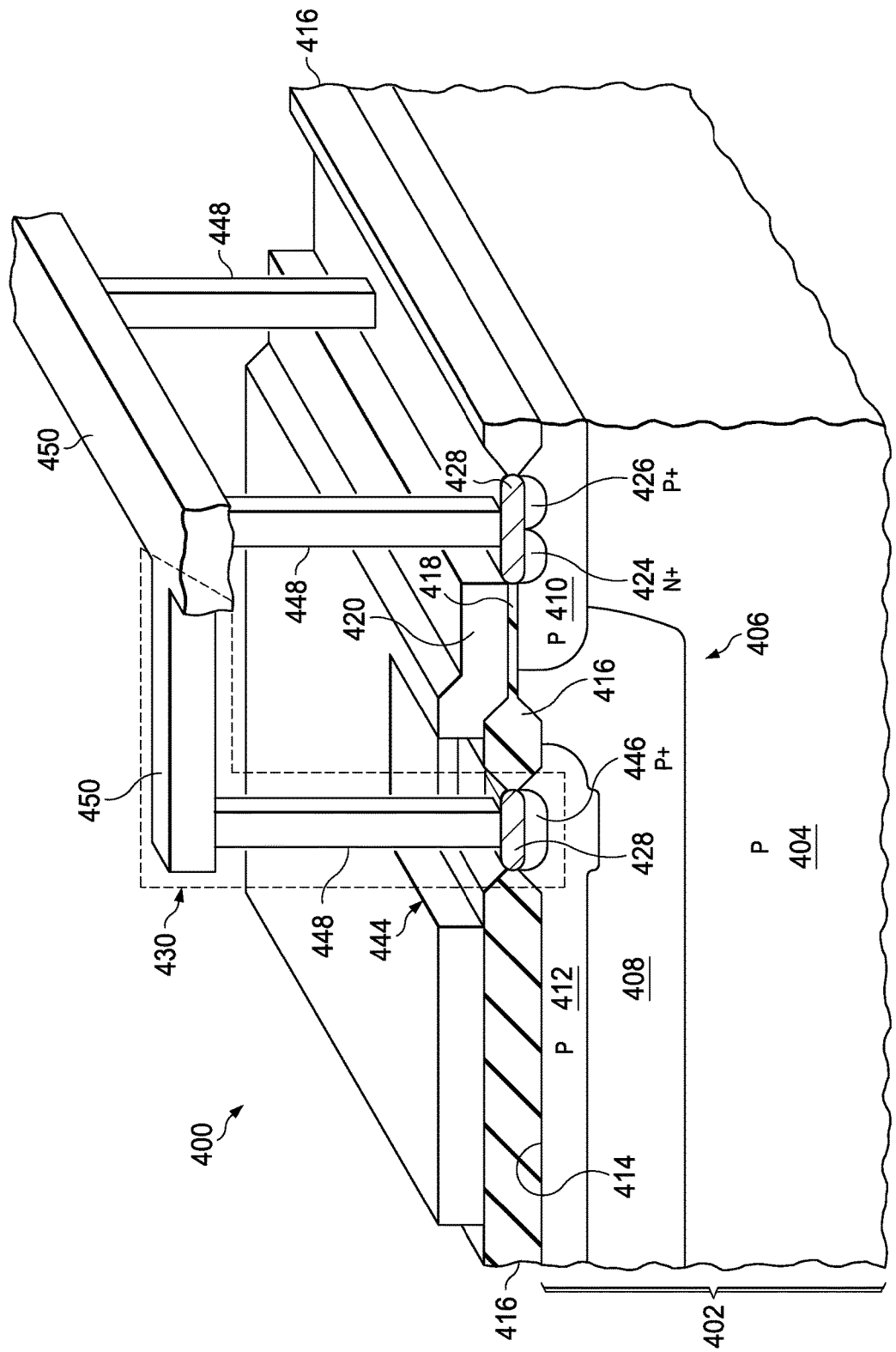
FIG. 4 is a cross section of a further example semiconductor device containing an LDNMOS transistor with a shunted RESURF layer.

FIG. 4 is a cross section of a further example semiconductor device containing an LDNMOS transistor with a shunted RESURF layer. The semiconductor device 400 is formed on a substrate 402 which includes a p-type semiconductor material 404, for example as described in reference to FIG. 1A. The semiconductor device 400 contains an LDNMOS transistor 406 which includes an n-type lateral drain drift region 408 in the substrate 402 from a drain contact region, not shown in FIG. 4, to a p-type body 410 of the LDNMOS transistor 406. A p-type RESURF layer 412 is disposed in the substrate 402 over at least a portion of the drain drift region 408. The RESURF layer 412 extends to a top surface 414 of the substrate 402 and is disposed under field oxide 416 formed over the substrate 402. A gate dielectric layer 418 is formed over the substrate 402 where the drain drift region 408 meets the body 410. A gate 420 of the LDNMOS transistor 406 is formed over the gate dielectric layer 418, and may extend over the field oxide 416 above the drain drift region 408 and the RESURF layer 412. An n-type source 424 is disposed in the body 410 adjacent to the gate 420, and a p-type body contact region 426 is disposed in the body 410 adjacent to the source 424.

An active area 444 of an interconnect shunt 430 is disposed through the field oxide 416 over the RESURF layer 412, proximate to the gate dielectric layer 418. The gate 420 is recessed from the active area 444. In one version of the instant example, the gate 420 may surround the active area 444, as shown in FIG. 4, to provide more complete field plate coverage over the drain drift region 408. In an alternate version, the gate 420 may be notched or segmented at the active area 444 to provide increased process latitude when patterning an etch mask for the gate 420. A p-type shunt contact region 446 is disposed in the active area 444, abutting the RESURF layer 412. Metal silicide 428 may be formed on the shunt contact region 446, the source 424 and the body contact region 426. Contacts 448 are formed on the metal silicide 428 to provide connections to the shunt contact region 446, the source 424 and the body contact region 426. The contacts 448 are formed through a pre-metal dielectric (PMD) layer, not shown in FIG. 4 to more clearly show the interconnect configuration. Metal interconnects 450 of a first metal level are formed on the contacts 448 to provide electrical connections to the LDNMOS transistor through the contacts 448. In the instant example, the interconnect shunt 430 extends from an instance of the metal interconnects over the source 424, through another instance of the metal interconnects 450, an instance of the contacts 448 and the shunt contact region 446 so as to couple the RESURF layer 412 to the source 424. The semiconductor device 400 may include a plurality of the shunts 430. During operation of the semiconductor device 400, the interconnect shunt 430 allows charge to flow between the RESURF layer 412 and the source 424. The shunt 430 advantageously reduces an on-state resistance of the LDNMOS transistor 406 as described in reference to FIG. 1A.

In another version of the instant example, the interconnect shunt 430 may include additional instances of the contacts 448, additional instances of the metal interconnects 450. In a further version, the interconnect shunt 430 may include one or more vias on the metal interconnects 450 and one or more interconnects of a second metal level on the vias.

The semiconductor device 400 may be formed by starting with a silicon wafer having the p-type semiconductor material 404 to provide the substrate 402. The p-type semiconductor material 404 extends to a top surface 414 of the substrate 402. The field oxide 416, and the active area 444, may be formed by a LOCOS process or an STI process.

In a version of the instant example using a LOCOS process, a layer of pad oxide is formed at the top surface 414 of the substrate 402 by thermal oxidation. A layer of silicon nitride is formed on the pad oxide, and a LOCOS mask is formed on the silicon nitride so as to expose the silicon nitride in areas for the field oxide 416 and cover areas for active areas of the semiconductor device 400, including the active area 444, the gate dielectric layer 418, the source 424 and the body contact region 426. The silicon nitride exposed by the LOCOS mask is removed by a reactive ion etch (RIE) process which is selective the pad oxide. The LOCOS mask is removed and thermal oxide is formed in the areas where the silicon nitride was removed, to form the field oxide 416. The silicon nitride is subsequently removed, for example using an aqueous solution of phosphoric acid.

In a version of the instant example using an STI process, a layer of pad oxide is formed at the top surface 414 by thermal oxidation. A layer of silicon nitride is formed on the pad oxide, and an STI mask is formed on the silicon nitride so as to expose the silicon nitride in areas for the field oxide 416 and cover areas for active areas of the semiconductor device 400, including the active area 444, the gate dielectric layer 418, the source 424 and the body contact region 426. The silicon nitride and the pad oxide are removed in the areas exposed by the STI mask, using an RIE process. The semiconductor material 404 is removed by another RIE process in the areas exposed by the STI mask to form isolation trenches. A layer of thermal oxide is formed in the isolation trenches, and silicon dioxide is formed on the thermal oxide and over the remaining silicon nitride, by any of several process such as atmospheric pressure chemical vapor deposition (APCVD), an ozonated chemical vapor deposition process referred to as a high aspect ratio process (HARP), or a high density plasma (HDP), so as to fill the isolation trenches. The silicon dioxide is removed from over the silicon nitride by a chemical mechanical polish (CMP) process, leaving the silicon dioxide in the isolation trenches to form the field oxide 416. The silicon nitride is subsequently removed using an aqueous solution of phosphoric acid.

The drain drift region 408 may be formed by ion implanting phosphorus and subsequently annealing the substrate 402 with a thermal drive process, as described in reference to FIG. 1A through FIG. 1C. The body 410 may be formed by implanting boron and subsequently annealing the substrate 402 as described in reference to FIG. 1A through FIG. 1C.

The RESURF layer 412 is formed by implanting p-type dopants such as boron through the field oxide 416, as described in reference to FIG. 1A through FIG. 1C. In the instant example, the RESURF layer 412 is formed so as to extend under the active area 444. For version of the instant example in which the field oxide 416 is formed by a LOCOS process, the RESURF layer 412 may be deeper under the active area 444, as indicated in FIG. 4.

The gate dielectric layer 418 and the gate 420 are formed over a boundary of the drain drift region 408 and the body 410. The source 424 is formed by implanting n-type dopants using an n-channel source-drain (NSD) mask.

A p-channel source-drain (PSD) mask is formed over the field oxide 416 so as to expose areas for the body contact region 426 and for the shunt contact region 446. The PSD mask may also expose areas for source and drain regions of PMOS transistors in the semiconductor device 400, if present. P-type dopants such as boron, possibly as $BF_2$, are implanted into the substrate 402 in the areas exposed by the PSD mask. The substrate 402 is subsequently annealed, for example by a rapid thermal processor, to activate the p-type dopants and so form the body contact region 426 and the shunt contact region 446.

The metal silicide 428 may be formed by forming a layer of refractory metal, such as platinum, titanium, cobalt, and/or nickel, over the field oxide 416 so as to contact the source 424, the body contact region 426 and the shunt contact region 446. The substrate 402 is heated, for example using a rapid thermal processor, so as to form the metal silicide 428. Unreacted refractory metal is removed by a wet etch, such as a mixture of sulfuric acid, hydrogen peroxide and water. The PMD layer is formed as a layer stack, including a PMD liner of silicon nitride, a layer of boron phosphorus silicate glass (BPSG) or phosphorus silicate glass (PSG) and a cap layer of silicon nitride or silicon oxynitride. The contacts 448 are formed by etching contact holes through the PMD layer to the metal silicide 428, and filling the contact holes with a liner of titanium by sputtering and titanium nitride by reactive sputtering or atomic layer deposition (ALD), and a fill metal of tungsten by metal organic chemical vapor deposition (MOCVD). The liner and fill metal are removed from over the PMD layer by a CMP process and/or an etchback process, leaving the liner and fill metal in the contact holes to provide the contacts 448.

The metal interconnects 450 may be formed by an etched metal process or by a damascene process. In a version of the instant example using the etched metal process, an adhesion layer of titanium is formed on the PMD, contacting tops of the contacts 448. A layer of aluminum, possibly with a few percent of silicon, copper and/or titanium, 100 nanometers to 1 micron thick, is formed on the adhesion layer. An optional cap layer of titanium nitride may be formed on the aluminum. An interconnect mask is formed over the aluminum layer, and over the cap layer if present, so as to cover areas for the metal interconnects 450. The cap layer, the aluminum and the adhesion layer are removed in areas exposed by the interconnect mask, leaving the metal interconnects 450. The interconnect mask is subsequently removed.

In a version of the instant example using the damascene process, an intra-metal dielectric (IMD) layer of silicon dioxide or low-k dielectric material, not shown in FIG. 4, is formed over the PMD layer. An interconnect trench mask is formed over the IMD layer so as to expose areas for the metal interconnects. The IMD layer is removed in the areas exposed by the interconnect trench mask so as to form interconnect trenches down to the contacts 448. A liner of tantalum or tantalum nitride is formed by sputtering, reactive sputtering, or ALD in the interconnect trenches and over the IMD layer. A seed layer of copper is formed by sputtering on the liner. Copper is electroplated on the seed layer so as to fill the interconnect trenches. The electroplated copper, the seed layer and the liner are removed from over the IMD layer by a copper CMP process, leaving the metal interconnects 450 in the interconnect trenches.

An extended drain PMOS transistor, with an n-type RESURF layer over a p-type lateral drain drift region and vertical shunts through the drain drift region between the RESURF layer and n-type material in the substrate bellow the drain drift region, may be formed as described in reference to FIG. 4 by appropriate change of polarities of dopants.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
    a substrate comprising p-type semiconductor material;
    a lateral extended drain n-channel metal oxide semiconductor (LDNMOS) transistor, comprising:
        a body of p-type semiconductor material disposed in the substrate; and
        a drain drift region of n-type semiconductor material disposed in the substrate, the drain drift region extending laterally to the body;
    a p-type layer of semiconductor material disposed in the substrate over at least a portion of the drain drift region, the p-type layer extending from the drain drift region to a top surface of the substrate, the p-type layer having an outermost edge on a side of the p-type layer nearest the body; and
    a lateral shunt of p-type semiconductor material disposed in the substrate, the lateral shunt extending to the top surface of the substrate and extending laterally from the p-type layer to the body, wherein a first portion of the outermost edge of the p-type layer adjacent to the lateral shunt is separated from the body by 1 micron to 2 microns more than a second portion of the outermost edge of the p-type layer.

2. The semiconductor device of claim 1, further comprising a field oxide layer extending over a complete width of the p-type layer.

3. The semiconductor device of claim 1, wherein the p-type layer is 1 micron to 5 microns thick, and has an average doping density of $1 \times 10^{16}$ cm$^{-3}$ to $1 \times 10^{17}$ cm$^{-3}$.

4. The semiconductor device of claim 1, wherein the lateral shunt is 1 micron to 5 microns thick, and has an average doping density of $2 \times 10^{16}$ cm$^{-3}$ to $2 \times 10^{17}$ cm$^{-3}$.

5. The semiconductor device of claim 1, wherein the lateral shunt is 1 micron to 5 microns wide.

6. The semiconductor device of claim 1, wherein a resistance of the lateral shunt is 1000 ohms to 10000 ohms.

7. The semiconductor device of claim 1, comprising a plurality of instances of the lateral shunt.

8. A semiconductor device, comprising:
    a substrate comprising p-type semiconductor material;
    a lateral extended drain n-channel metal oxide semiconductor (LDNMOS) transistor, comprising:
        a body of p-type semiconductor material disposed in the substrate; and
        a drain drift region of n-type semiconductor material disposed in the substrate, the drain drift region extending laterally to the body;
    a p-type layer of semiconductor material disposed in the substrate over at least a portion of the drain drift region, the p-type layer extending from the drain drift region to a top surface of the substrate and the p-type layer extending partially under a gate electrode of the LDNMOS, wherein the p-type layer has an outermost edge on a side of the p-type layer nearest the body;
    a field oxide layer extending over the p-type layer past an edge of the gate electrode;
    a lateral shunt of p-type semiconductor material disposed in the substrate, the lateral shunt extending to the top surface of the substrate and extending laterally from the p-type layer to the body, wherein a first portion of the outermost edge of the p-type layer adjacent to the lateral shunt is separated from the body by a greater distance than a second portion of the outermost edge of the p-type layer;
    a region of higher dopant concentration in the body between a source node and the drain drift region;

a buried region of n-type semiconductor material in the substrate below the body; and an n-type sinker extending from the buried region to the top surface of the substrate.

9. The semiconductor device of claim 8, wherein the p-type layer is 1 micron to 5 microns thick, and has an average doping density of $1\times10^{16}$ cm$^{-3}$ to $1\times10^{17}$ cm$^{-3}$.

10. The semiconductor device of claim 9, wherein the lateral shunt is 1 micron to 5 microns thick, has an average doping density of $2\times10^{16}$ cm$^{-3}$ to $2\times10^{17}$ cm$^{-3}$, and is 1 micron to 5 microns wide.

11. The semiconductor device of claim 10, comprising a plurality of instances of the lateral shunt.

* * * * *